(12) United States Patent
Master et al.

(10) Patent No.: US 6,536,649 B1
(45) Date of Patent: Mar. 25, 2003

(54) METHOD OF PREVENTING RESIDUE CONTAMINATION OF SEMICONDUCTOR DEVICES DURING FURNACE PROCESSING

(75) Inventors: Raj N. Master, San Jose, CA (US); Jonathan D. Halderman, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 96 days.

(21) Appl. No.: 09/627,437

(22) Filed: Jul. 28, 2000

(51) Int. Cl.[7] .......................... B23R 37/04; B23R 5/00; F27D 11/00
(52) U.S. Cl. ..................... 228/49.5; 228/19; 228/42; 228/206; 228/205; 228/102; 228/103; 134/1.1; 219/388; 219/390
(58) Field of Search .................. 228/49.5, 19, 42, 228/206, 203, 102–104; 134/1.1; 219/388, 390

(56) References Cited

U.S. PATENT DOCUMENTS

| | | | |
|---|---|---|---|
| 4,126,396 A | | 11/1978 | Hartmann et al. |
| 4,269,592 A | * | 5/1981 | Benton et al. ............... 134/1.1 |
| 4,330,260 A | * | 5/1982 | Jorgensen et al. ............. 431/12 |
| 4,829,246 A | * | 5/1989 | Mathur et al. ............... 110/349 |
| 5,208,162 A | * | 5/1993 | Osborne et al. ........... 324/71.2 |
| 5,225,675 A | * | 7/1993 | O'Donnell .................... 134/113 |
| 5,420,440 A | * | 5/1995 | Ketler et al. ................. 250/573 |
| 5,579,981 A | * | 12/1996 | Matsumura et al. ........ 219/201 |
| 5,879,574 A | * | 3/1999 | Sivaramakrishnan et al. .. 134/1.1 |
| 6,202,318 B1 | * | 4/2000 | Guldi et al. ................... 134/21 |
| 6,120,585 A | * | 9/2000 | Inomata et al. ............ 55/315.1 |
| 6,146,448 A | * | 11/2000 | Shaw et al. ..................... 34/73 |
| 6,347,636 B1 | * | 9/2002 | Xia et al. ..................... 134/1.1 |

FOREIGN PATENT DOCUMENTS

| | | | |
|---|---|---|---|
| JP | 62-42518 A | * | 2/1987 |
| JP | 62-195081 A | * | 8/1987 |

* cited by examiner

*Primary Examiner*—M. Alexandra Elve
*Assistant Examiner*—L. Edmondson

(57) ABSTRACT

Residue contaminates semiconductor devices during processing in a furnace. Residue contamination is prevented by removing the residue before it builds up to a point where it can contaminate semiconductor devices. Residue build-up is monitored using a residue build-up monitoring device mounted on the furnace exhaust stack. When residue build-up reaches a predetermined level a signal is generated by the residue build-up monitoring device notifying technicians that furnace cleaning is required.

18 Claims, 5 Drawing Sheets

METHOD OF PREVENTING RESIDUE CONTAMINATION OF SEMICONDUCTOR DEVICES DURING FURNACE PROCESSING

TECHNICAL FIELD

This invention generally relates to the field of semiconductor device manufacturing, and more particularly, to furnaces and the processing of semiconductor devices in furnaces.

BACKGROUND OF THE INVENTION

Semiconductor device components undergo a number of processing steps that involve heating and possible contamination from residue created during heating steps. Organic residues are generated in furnaces during heating processes involving organic compounds. Heating processes that generate residue contaminants include epoxy resin curing and reflow soldering.

Semiconductor device components, such as flip chips and packages, are conventionally joined together by soldering. In order to efficiently solder in a production environment, solder reflow furnaces are used. In a solder reflow furnace, semiconductor components are placed on a conveyor belt and conveyed through a tunnel-type furnace. The semiconductor components are heated to above the melting point of the solder while in the furnace, permitting the solder to flow and to bond the parts. To provide a good joint the solder is typically heated to about 50° C. above its melting point. Solder reflow furnaces are usually operated from about 200° C. to about 400° C.

Typically, reflow furnaces are heated by either a hot gas or infrared radiation. In general, then, solder reflow furnaces can be classified as radiation-types or hot gas-types. The radiation-type reflow furnace is one in which a number of heater panels are disposed in the upper and lower portions of a tunnel and semiconductor devices are heated by the heat radiated from the heater panels. The furnace is heated to a suitable temperature for soldering by controlling the current supplied to the heater panels. Radiation emitted from the heater panels can either be near or far infrared radiation.

A solder reflow furnace of the hot gas type is one in which hot gas is circulated past a heater providing a constant heating temperature. Typically, nitrogen is the gas of choice in a reflow furnace. However, other inert gases can also be used, as well as hydrogen. Although nitrogen is not a class VIIIA element, as used herein nitrogen will be considered an inert gas. Inert gases and hydrogen are used in both hot gas-type and radiation-type reflow furnaces to limit-the amount of oxygen present in the furnace. Low oxygen levels are desirable to prevent oxidation of the components being soldered.

With reference to FIG. 8, a typical reflow furnace 120 according to the prior art is illustrated. The furnace 120 includes a conveyor belt 126 for passing the semiconductor devices through the furnace. Heating elements 124 heat the furnace to the desired operating temperature. Inert gas enters the furnace through gas inlet 122 and exits through furnace exhaust stack 128.

Before the circuit board enters the furnace 120, solder paste is applied to the areas to be soldered. As well as solder, solder paste includes flux and other additives, such as a solvent. The solder is used to form a metallurgically sound solder joint, which will both hold the various electronic components in place and conduct electrical signals. The flux has a variety of purposes, which include removing oxides from metallization on the circuit board; removing oxides on the molten solder to reduce the surface tension and enhance flow; inhibiting subsequent oxidation of the clean metal surfaces during soldering; and assisting in the transfer of heat to the joint during soldering.

Many problems associated with this process are generated by use of the flux. Depending upon the type of flux paste used, a flux residue can remain after reflow soldering. The residue comprises a carrier, such as rosin or resin that is not evaporated, acid or salt deposits, and the removed oxides. If not removed, this residue can be detrimental to the long-term reliability of an electronic package. The resin can also absorb water and become an ionic conductor, which could result in electrical shorting and corrosion. Additionally, the residual flux can, over a period of time, corrode the soldered components and cause electrical open circuits.

Several different types of fluxes are commonly used in the semiconductor manufacturing industry, including cleanable and no-clean fluxes. Cleanable fluxes include resin-type fluxes, such as Alpha 102–1500 manufactured by Alpha Metals, and water soluble fluxes. When a flux is used that leaves corrosive and/or hygroscopic residues, post-soldering cleaning using chlorinated fluorocarbons (CFCs), organic solvents, semi-aqueous solutions, or water is required. For this type of process, in addition to volatile organic compound emissions from the soldering process, the cleaning process results in emission of CFCs and wastewater. These emissions detrimentally add to environmental pollution and production costs.

Recently no-clean fluxes have begun to be used in the reflow soldering industry. Instead of the residue remaining on the circuit board after reflow welding, these no-clean fluxes are designed to undergo chemical decomposition at a given temperature, also known as pyrolyzation, during which the residue is volatilized into the furnace atmosphere. Because this flux leaves little or no residue, the need to clean the circuit board after reflow welding is negated.

A problem associated with all types of fluxes is that the volatilized residue vapor in the furnace atmosphere tends to condense very quickly onto cool surfaces within the reflow furnace.

Volatilized flux is carried out through the furnace exhaust stack by the gas circulating in the furnace. In a high volume production environment, some of the volatilized flux condenses as a residue on the inside walls of the furnace and the inside walls of the furnace exhaust stack. As the build-up of the flux residue increases, it starts to drip from the furnace walls and exhaust stack-walls and falls onto the production parts, contaminating the parts. Flux residue contamination of production parts will cause rejection of the parts. Flux residue contamination of production parts leads to a lower yield of production parts, and therefore, higher manufacturing costs.

The term semiconductor devices as used herein are not be limited to the specifically disclosed embodiments. Semiconductor devices as used herein includes a wide variety of electronic devices including flip chips, flip chip/package assemblies, transistors, capacitors, microprocessors, random access memories, etc. In general, semiconductor devices refer to any electrical device comprising semiconductors.

SUMMARY OF THE INVENTION

There exists a need in the semiconductor device processing art to control and/or eliminate the problem of residue contamination of production parts in a furnace.

This and other needs are met by the embodiments of the present invention, which provide a method of preventing residue contamination of semiconductor devices during furnace processing. Semiconductor devices are conveyed through a furnace comprising an exhaust stack. Gas is flowed through the furnace and exits through the exhaust stack. Residue build-up is monitored using a device attached to the exhaust stack. A signal is generated by the device when the amount of residue build-up reaches a predetermined amount.

The earlier stated needs are also met by another embodiment of the instant invention that provides a furnace. The furnace comprises heating elements that heat the furnace, a conveyor that conveys semiconductor devices through the furnace, and an exhaust stack for venting gases from the furnace. A device for monitoring residue build-up in the furnace is attached to the exhaust stack.

The residue build-up monitoring device monitors the amount of residue build-up on the walls of the exhaust stack. Through empirical determinations, the amount of residue build-up on the walls of the exhaust stack is correlated to the amount of residue build-up on the inner furnace walls.

The residue build-up monitoring device uses light beams to monitor the amount of residue build-up. The transmittance of a light beam across the exhaust stack is measured when the walls are free of residue build-up. This baseline information is stored in the device. The device continuously monitors transmittance of the light beam across the exhaust stack. When the transmittance drops to a predetermined level, indicating that residue build-up has reached the point where removal of the residue build-up is required to prevent contamination of production parts, the device transmits a signal to a display notifying technicians that cleaning of the furnace and exhaust stack is required. At this point, technicians can clean the furnace and exhaust stack before any contamination of production parts occurs.

Some advantages of the instant invention include improved reliability of semiconductor devices, reduced production costs due to fewer rejected parts, and an increased production yield due to fewer rejected parts. The furnace of the present invention provides cleaner semiconductor devices with higher yields. The instant invention provides a more efficient manufacturing process in which fewer parts will require reworking. In addition, productivity enhancement is also accomplished by accurate determination of the furnace cleaning schedules. Furnace cleaning is only performed when needed.

The foregoing and other features, aspects, and advantages of the present invention will become more apparent from the following detailed description of the present invention when taken in conjunction with the accompanying drawings.

DETAILED DESCRIPTION

This invention allows production of semiconductor devices with increased yields and increased reliability at reduced costs. This is accomplished by real-time monitoring of residue build-up in furnaces. A device for monitoring residue build-up is attached to the exhaust stack of a furnace. The device monitors residue build-up and generates a signal alerting technicians that residue build-up needs to be removed from the inner walls of the furnace and the exhaust stack. Based upon empirical data, the device is programmed to provide a warning signal when a predetermined level of residue build-up is reached so that the furnace is cleaned before contamination of production parts occurs.

The monitoring device comprises a light emitter and a light sensor. Light from the light emitter is directed across the furnace stack to the light sensor. The light passes through residue build-up that forms on the inner walls of the exhaust stack. As the residue build-up grows, the amount of light reaching the light sensor decreases. This decreased transmission of light is measured by the light sensor in terms of percent transmittance. When the transmittance reaches a predetermined level a signal is generated by the device indicating that cleaning of the furnace and stack is required.

The invention will be described by referring to embodiments comprising a solder reflow furnace and flux residue generated in the solder reflow furnace. These embodiments are illustrative and do not limit the scope of the claims. It is understood that the present invention encompasses additional furnace processing including preventing residue contamination during epoxy curing processes, such as curing anisotropic and isotropic curing adhesives; and processing polymer coated solder balls.

Figure 1:
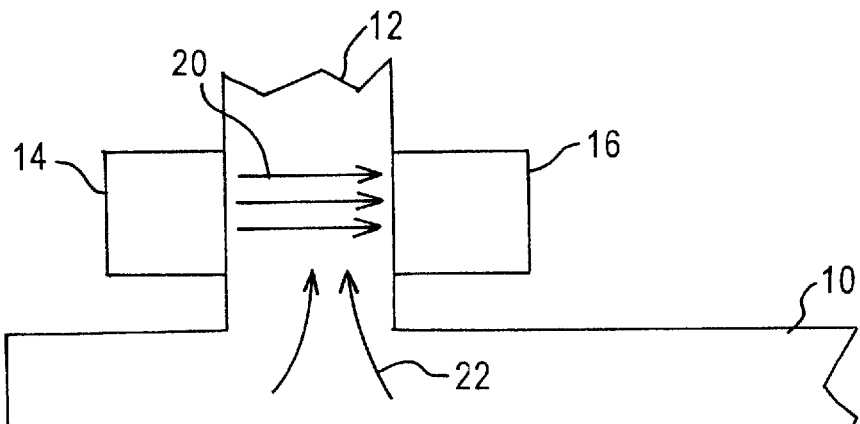
FIG. 1 shows a reflow furnace according to one embodiment of the present invention.
Figure 2:
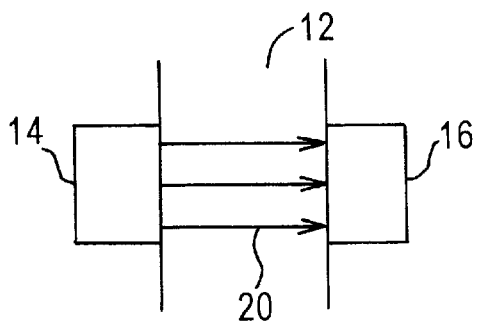
FIG. 2 shows the emitter and sensor without flux residue build-up.
Figure 3:
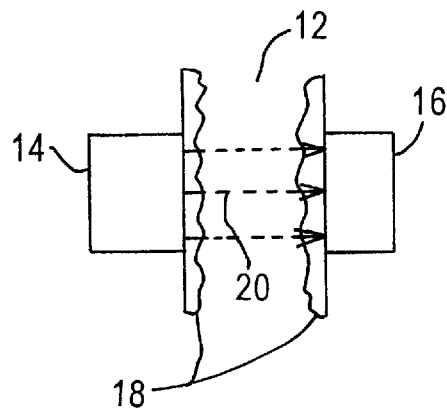
FIG. 3 shows the emitter and sensor with flux residue build-up.

FIG. 1 shows a portion of a solder reflow furnace 10 with exhaust gas 22 flowing up exhaust stack 12. Light 20 from emitter 14 traverses the exhaust stack 12 and is detected by light sensor 16. FIG. 2 is a view of the flux residue build-up monitoring device showing no flux residue build-up on the walls of the exhaust stack. Light 20 emitted from light emitter 14 travels across solder reflow furnace exhaust stack 12 where it impinges upon light sensor 16. FIG. 3 shows flux residue build-up 18 on the walls of exhaust stack 12. The flux residue build-up is deposited by exhaust gas 22. FIG. 3 shows that light rays 20 are weakened in intensity after passing through flux residue build-up 18. The attenuation of the light rays 20 is due to the flux residue build-up absorbing light emitted by emitter 14 resulting in a lower light transmittance measured by sensor 16.

Figure 4:
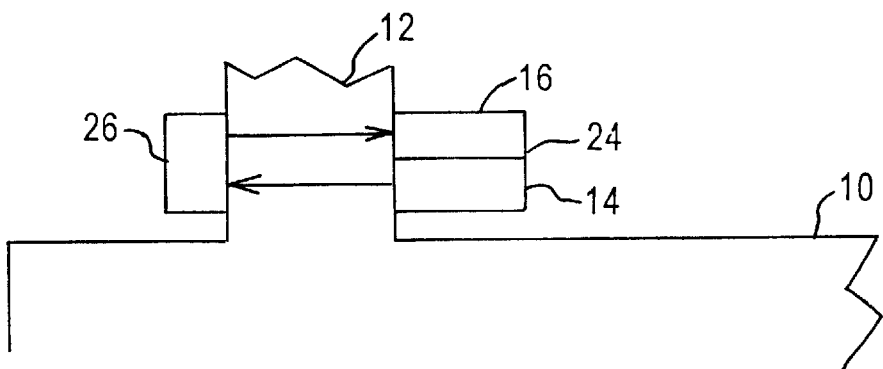
FIG. 4 depicts a reflow furnace according to another embodiment of the present invention where the sensor and emitter are located adjacent to each other.

FIG. 4 shows a solder reflow furnace 10 with a flux residue build-up monitoring device comprising a double pass configuration. The emitter 14 and sensor 16 are both located in common housing 24. The emitter 14 emits light which passes through exhaust stack 12 where it is reflected by reflector 26 back towards housing 24 where the transmittance is measured by light sensor 16 in housing 24. This configuration allows the emitter 14, sensor 16, and the associated electronics to be contained within a single housing 24.

Figure 5:
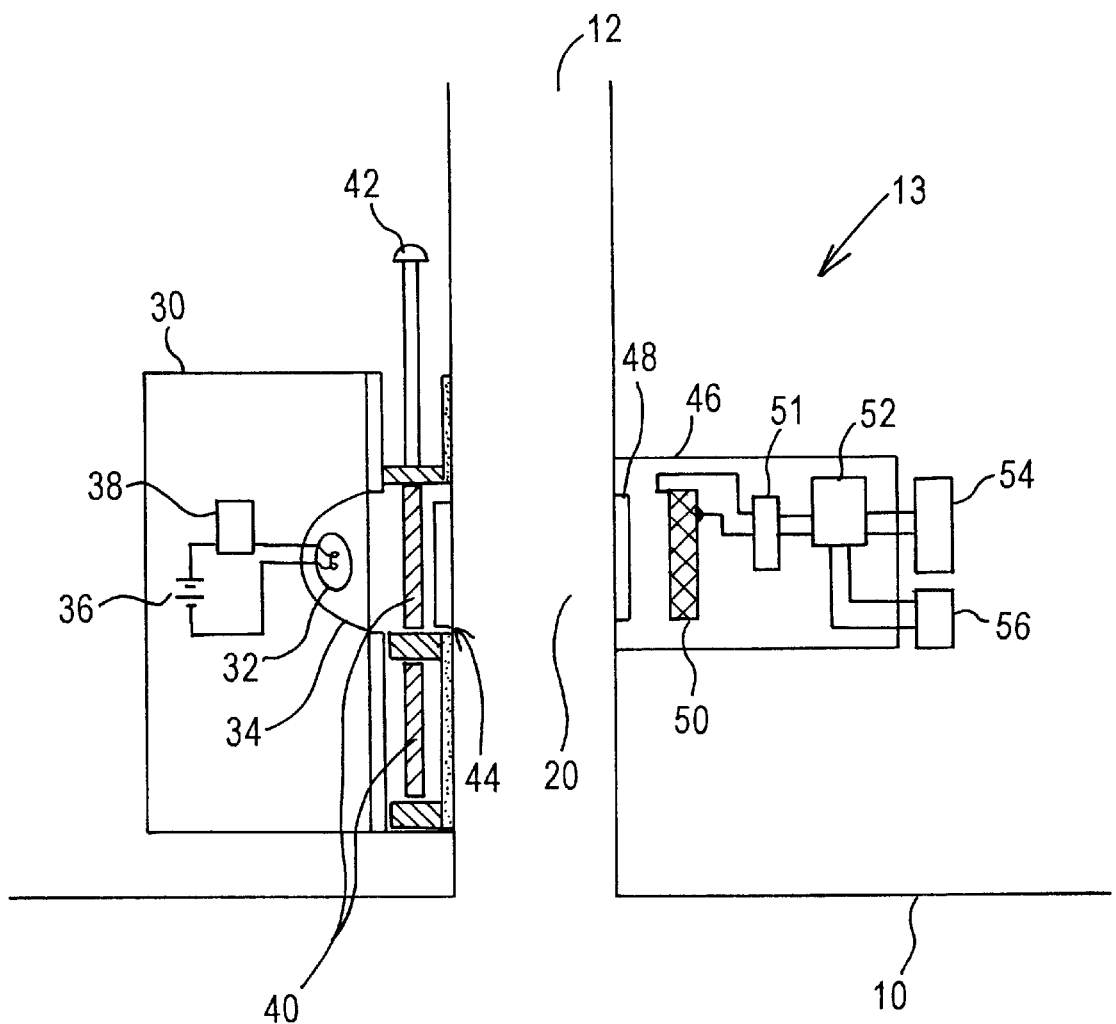
FIG. 5 depicts an embodiment of the present invention that uses a single beam light source.

FIG. 5 illustrates an embodiment of the present invention employing a single beam spectrometer. Solder reflow furnace 10 includes an exhaust stack 12. The flux residue build-up monitoring device 13 comprises an emitter 30 mounted on one side of the exhaust stack 12 and a sensor 46 mounted on the opposing side of exhaust stack 12. Light rays 20 are produced by lamp 32 and collimated by reflector 34. Light rays 20 are directed through filter 40 and window 44 across exhaust stack 12 and through window 48 where the light rays 20 impinge on photodetector 50. The amount of light striking photodetector 50 is transduced to a voltage signal by photodetector 50 and converted to a digital signal by an analog to digital (A/D) converter 51. The digital signal provided by A/D 51 converter is supplied to the microprocessor 52. Microprocessor 52 compares the light transmittance against light transmittance parameters input at the data input device 56. The data inputted at data input device 56 can include the baseline transmittance and the minimum transmittance which would generate an alarm indicating that flux residue build-up has reached the point where removal of the flux residue build-up is required. Display 54 displays flux residue build-up data generated by microprocessor 52 and an alarm if an alarm set point is reached. To ensure that accurate light transmittance data is generated, the lamp 30 has to emit a constant intensity of light. Lamp control 38 regulates the power from lamp power supply 36 to ensure the lamp 30 emits light at a constant intensity.

For improved sensitivity of the flux residue build-up monitoring device 13, filter 40 is used in certain embodiments to isolate a narrow band of wavelengths of light 20. The filter 40 is chosen so that the wavelengths transmitted will include wavelengths that are absorbed by the flux residue. Wavelength bandwidths are selected so that the radiation absorbed by the flux residue is not a wavelength that is absorbed so strongly that no or little light will be transmitted to the sensor. Rather a wavelength is chosen that provides sufficient sensitivity to serve as an indicator of flux residue build-up. Filter 40 further comprises a zero transmittance filter that blocks all of the radiation 20 from passing. The zero transmittance filter is used to obtain a zero transmittance baseline for calibrating the monitoring device. Filter holder 42 includes a handle for switching between the zero transmittance filter and the filter used in monitoring the flux residue build-up. Filters 40 are mounted on a common substrate and switched using the handle of the filter holder 42.

The light 20 emitted by the emitter 30 is infrared, visible, or ultraviolet light. The following are suitable light sources for the emitter: hydrogen and deuterium discharge lamps, incandescent filament lamps, Nernst glowers, Globars, Nichrome wire coils, cartridge heaters, light emitting diodes, high-pressure mercury arc lamps, low-pressure mercury-vapor lamps, and xenon arc lamps. Incandescent filament lamps include both tungsten wire lamps and tungsten-halogen lamps. The lamps listed herein represent conventional illumination sources for spectrometers. The choice of lamp used, as known by one of skill in this art, depends on the wavelength of light desired to be emitted by the emitter.

The windows 44, 48 are mounted at holes formed in the exhaust stack. The window glass should not absorb the wavelengths of interest. Conventional spectrometric window glasses can be used for the windows 44, 48.

After light 20 passes through exhaust stack 12 and window 48 it impinges upon photodetector 50. Photodetector 50 includes photovoltaic devices, such as selenium, silicon pn junction, or InSb pn junction photovoltaic cells. In addition, in certain embodiments using infrared radiation, thermal detectors such as thermocouples, thermopiles, thermistors, Golay cells, and pyroelectric detectors are used as the photodetector. These are all conventional photodetectors. As is conventionally known, the light source and photodetectors are chosen so as to optimize the sensitivity of the wavelengths of light being used.

Emitter 30 and sensor 46 are mounted such that they are easily removed when cleaning of the windows 44, 45 is required. The windows 44, 48 should be cleaned whenever the furnace is cleaned. Cleaning is accomplished by either detaching the device 13 and removing the windows 44, 48 and replacing them with new windows 44, 48 or detaching the device 13 and cleaning the windows 44, 48 and reinstalling the device 13. Depending on time and cost considerations, rather than cleaning the device, the device is removed and a new device is installed.

The solder reflow furnace is cleaned by heating the furnace to a temperature sufficient for volatilizing the flux residue build-up. Depending on the type of flux used, the temperature of the furnace is raised so that its temperature is about 500° C. to about 1,000° C. to volatilize the flux residue build-up which is deposited on the walls of the furnace. The volatilized flux residue is carried out of the furnace by the exhaust gas. In one embodiment, the temperature of the furnace is raised to about 800° C. Of course, to prevent damage to production parts, the temperature of the furnace should not be raised into the cleaning temperature range while production parts are being conveyed through the furnace. After removal of the flux residue build-up, the furnace is allowed to cool back to its operating temperature and then soldering of production parts resumes. The hot exhaust gases exiting the furnace during the flux residue removal heating provide an alternative method of cleaning the flux residue build-up on the windows of the flux residue monitoring device.

Microprocessor 52 is used for calculating the transmittance of the light impinging on the photodetector, signal processing, calibration of the flux residue build-up monitoring device, temperature compensation of the data, signaling the cleaning alarm, and diagnostics including power failure, light source failure, and photodetector failure.

Figure 6:
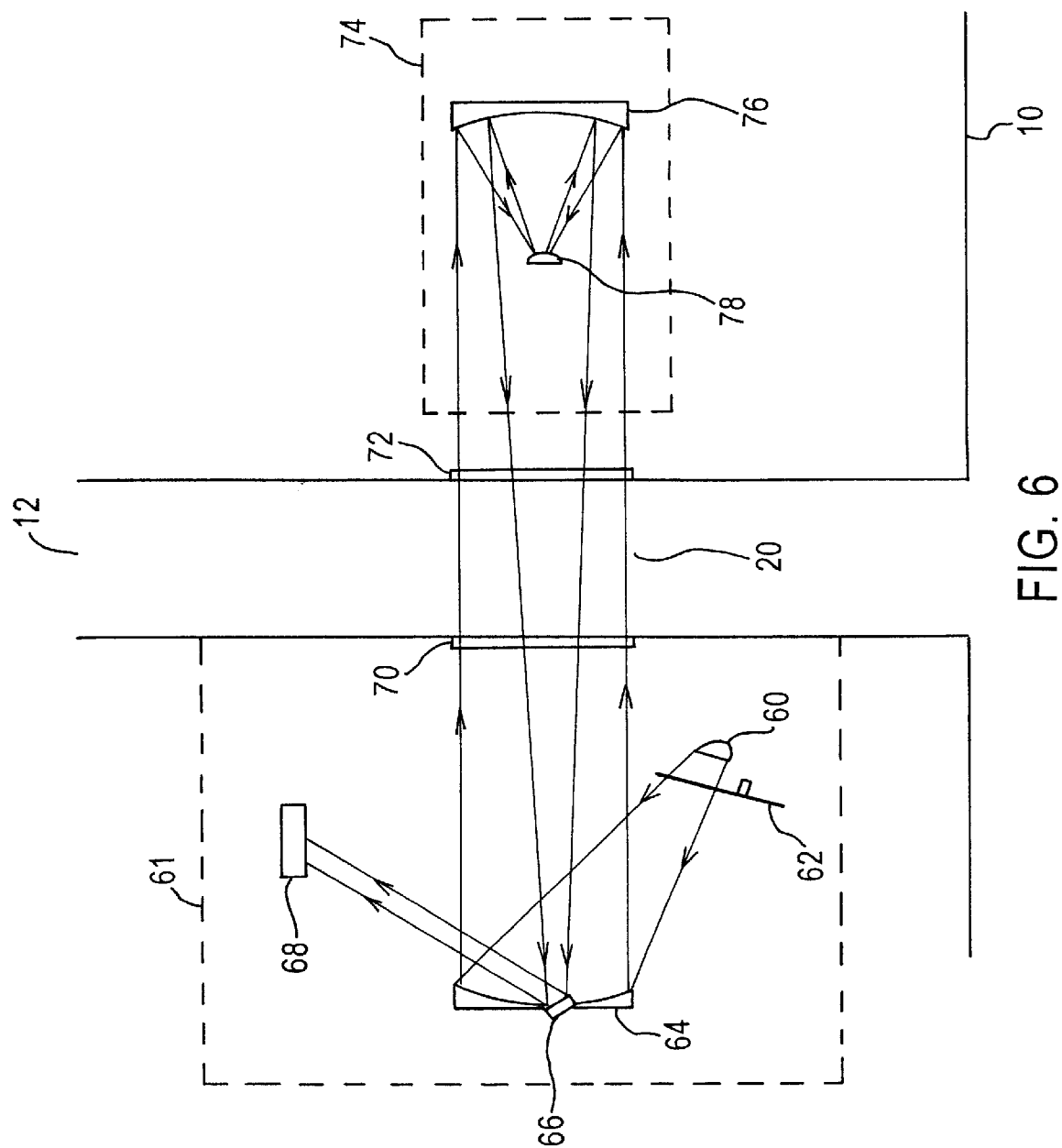
FIG. 6 depicts an embodiment of the present invention that uses a reflector to reflect the light back across the exhaust pipe.

An alternative embodiment of the present invention is illustrated in FIG. 6. In this embodiment the emitter and sensor are enclosed within a common housing 61 on the same side of the exhaust stack 12. Lamp 60 emits light 20. Light 20 is first passed through chopper 62. The chopper 62 is placed in the light path to provide pulses of light to the sensor at a frequency determined by the chopper, thereby providing the ability to reject spurious data. After passing through the chopper 62 the light 20 is reflected off concave mirror 64, which collimates the light and directs it through window 70, across exhaust stack 12, and through window 72 where the light is redirected by a reflector 74 back across the exhaust stack 12. Reflector 74 is shown as a cassegrain reflector, where the light is first reflected off concave primary mirror 76 towards secondary mirror 78 which directs the light back onto primary mirror 76 which focuses the light onto plane mirror 66, back across exhaust stack 12, plane mirror 66, in turn, reflects the light onto photodetector 68. Alternatively, reflector 74 is a cube-corner reflector. This embodiment allows the emitter and sensor and all the accompanying electronics to be located within a common housing 61.

Figure 7:
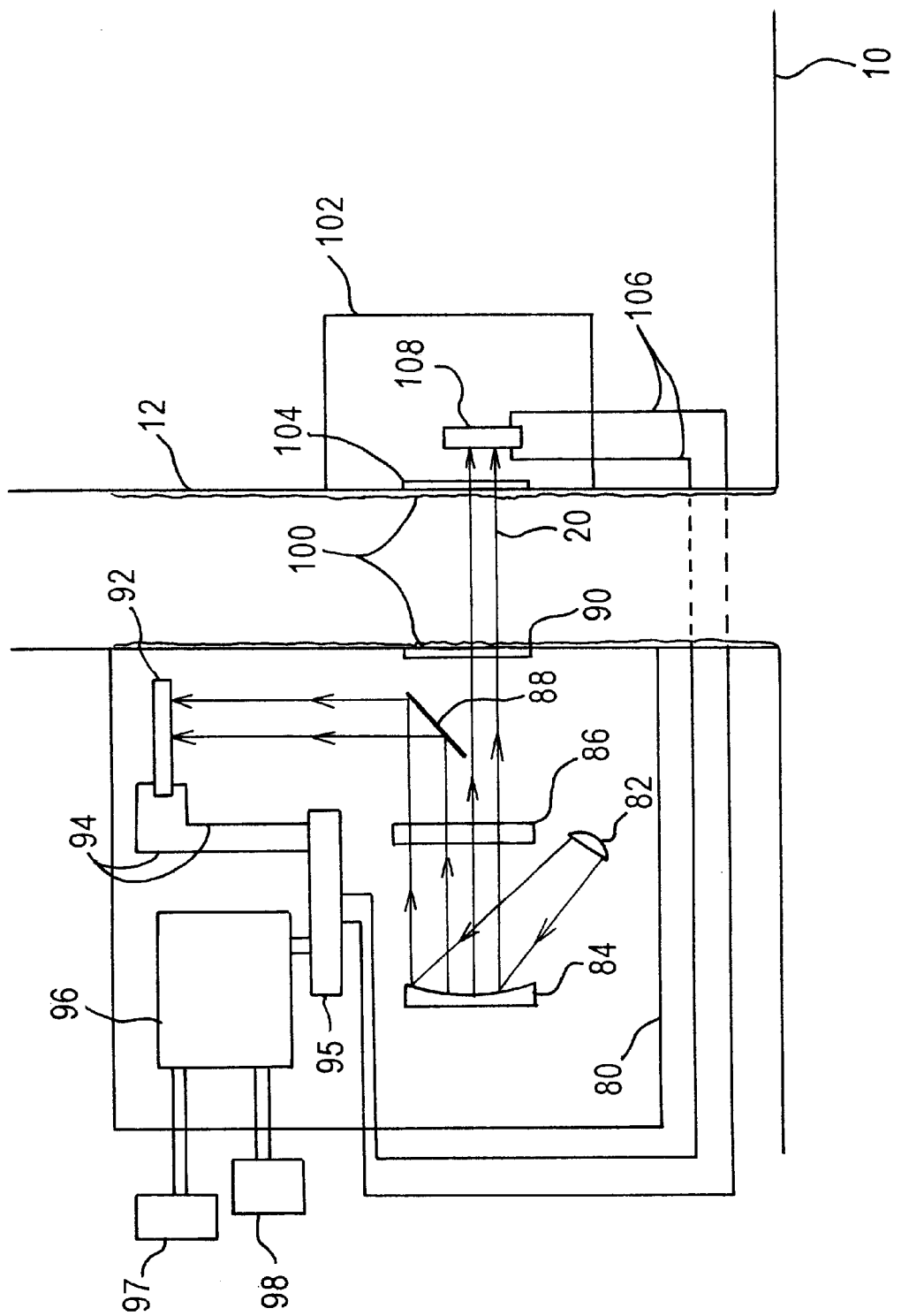
FIG. 7 depicts an embodiment of the instant invention that uses a reference light beam.
Figure 8:
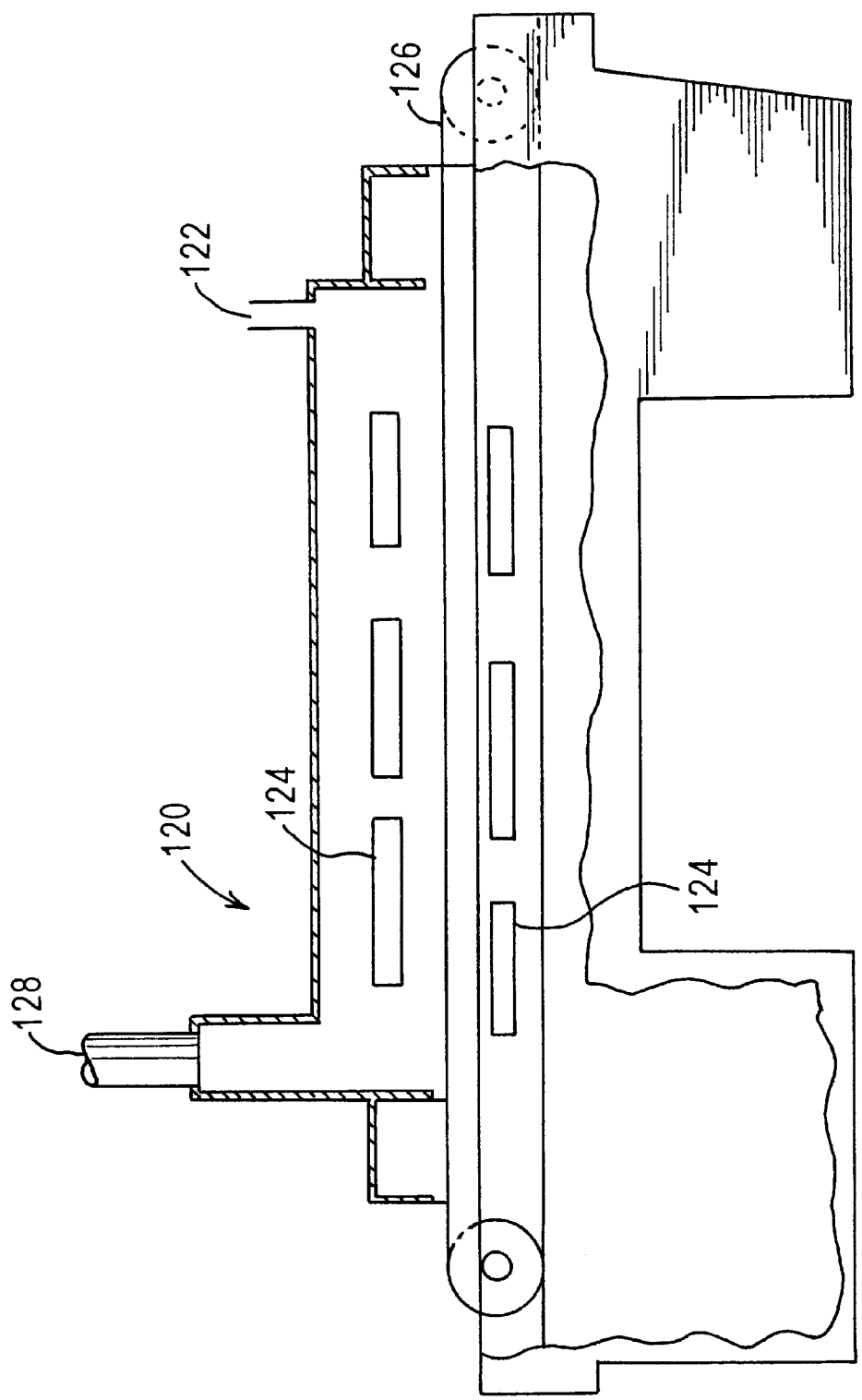
FIG. 8 depicts a prior art solder reflow furnace.

In another embodiment of this invention, a calibration light beam path is provided which bypasses the exhaust stack on its way to a photodetector. FIG. 7 illustrates this embodiment. Light source 82 emits light 20 that is collimated by concave mirror 84 and directed towards photodetector 108. The light passes through filter 86 that narrows the band of wavelengths to those that are of interest. After the light passes through the filter, half the light is diverted by plane mirror 88 to impinge upon photodetector 92. The remaining light passes through window 90 and flux residue 100, across the exhaust stack 12, and through flux residue 100 and window 104 where it reaches sensor 102 and impinges upon photodetector 108. The light which impinges upon photodetector 108 generates an electrical current in leads 106 which are connected to A/D converter 95. The digital signed is provided to microprocessor 96 or other digital logic in the emitter housing 80. The electrical signal generated by the light passing through the exhaust stack 12 is compared to the signal generated by photodetector 92 from the light which did not pass through the exhaust stack 12. Electrical leads 94 carry the signal generated by photodetector 92 through A/D converter 95 to microprocessor 96. Microprocessor 96 compares the data from the light passing through the flux residue build-up and the reference beam and calculates the amount of flux residue build-up. The flux residue build-up data is then outputted by the microprocessor 96 to output display 98. If the transmittance calculated by microprocessor 96 falls below the alarm set point, input at data input device 97, an alarm signal would be generated and transmitted to output display 98 to notify technicians that the furnace requires cleaning.

Instead of digital logic, such as microprocessors, embodiments of the invention which employ analog circuitry to compare the light transmittance and provide an alarm signal are contemplated. The analog circuitry is readily provided by one of ordinary skill in the art.

The spectrophotometer illustrated in FIG. 7, a double beam spectrophotometer, provides improved accuracy. The reference beam allows for any variation in the lamp source intensity to be figured into the transmittance calculations. The reference beam embodiment allows for continuous calibration that provides improved accuracy over the single beam embodiment in which the instrument is periodically calibrated.

Although the embodiments illustrated employed mirrors for collimating and focusing the light rays, as is known to those of skill in this art, lenses can be substituted for the mirrors to collimate and focus the light rays as appropriate.

The real-time monitoring of the present invention allows for increased quality control of semiconductor devices processed in a furnace. Because the residue build-up is monitored continuously, when an unacceptable level of residue build-up is reached an alarm is generated, and production can be stopped. The build-up is then removed before the production parts suffer contamination from the residue. The present invention increases the yield of semiconductor devices processed in furnaces. The level of transmittance that will trigger an alarm is determined through empirical methods. Tables and charts containing residue build-up data and the level of contaminated parts obtained are produced through routine testing. This data is used to determine when residue removal procedures need to be performed on the furnace.

The embodiments illustrated in the instant disclosure are for illustrative purposes only and should not be construed to limit the scope of the claims. As is clear to one of ordinary skill in the art, the instant disclosure encompasses a wide variety of embodiments not specifically illustrated herein.

What is claimed is:

1. A method of preventing residue contamination of semiconductor devices during processing in a solder reflow furnace comprising:

conveying at least one semiconductor device through a solder reflow furnace, said furnace comprising an exhaust stack;

flowing a gas through the furnace, wherein at least some of said gas exits the furnace through the exhaust stack;

monitoring residue build-up in the furnace exhaust stack, wherein residue build-up is monitored using a light emitter and light sensor by directing light emitted from the emitter through the exhaust stack to the sensor; and generating a signal when the amount of residue build-up reaches a predetermined amount.

2. The method of claim 1, further comprising removing residue build-up from the furnace in response to the generation of the signal.

3. The method of claim 2, wherein said removing residue build-up comprises heating the furnace to a temperature sufficient for volatilizing the residue build-up in the furnace.

4. The method of claim 3, wherein the furnace is heated to a temperature of about 500° C. to about 1,000° C.

5. The method of claim 1, wherein the light emitter comprises a light source selected from the group consisting of infrared, visible, and ultraviolet light sources.

6. The method of claim 1, wherein the light emitter and sensor are mounted on the external wall of the exhaust stack, with a plurality of windows provided in the exhaust stack that allow light emitted by the light emitter to pass through the exhaust stack.

7. A method of preventing residue contamination of semiconductor devices during processing in a furnace comprising:

conveying at least one semiconductor device through a furnace, said furnace comprising an exhaust stack;

flowing a gas through the furnace, wherein at least some of said gas exits the furnace through the exhaust stack;

monitoring residue build-up in the furnace exhaust stack, wherein residue build-up is monitored using a light emitter and light sensor by directing light emitted from the emitter through the exhaust stack to the sensor; and generating a signal when the amount of residue build-up reaches a predetermined amount, wherein the residue is a flux residue.

8. A solder reflow furnace comprising:

at least one heating element for heating the furnace;

a conveyor for conveying semiconductor devices through the furnace;

an exhaust stack for venting gases from the furnace;

a device for monitoring residue build-up in the furnace exhaust stack attached to the exhaust stack, wherein the device for monitoring residue build-up comprises a light emitter and a light sensor.

9. The furnace of claim 9, wherein the light emitter comprises a light source selected from the group consisting of infrared, visible, and ultraviolet light sources.

10. The furnace of claim 9, wherein the light source is selected from the group consisting of hydrogen and deuterium discharge lamps, incandescent filament lamps, Nernst glowers, Globars, Nichrome wire coils, cartridge heaters, light emitting diodes, high-pressure mercury arc lamps, low-pressure mercury-vapor lamps, and xenon arc lamps.

11. The furnace of claim 8, wherein the device for monitoring residue build-up comprises a plurality of windows to allow light emitted by the light emitter to pass through the exhaust stack and to be detected by the light sensor.

12. The furnace of claim 11, wherein the light emitter and light sensor are mounted on opposing sides of the exhaust stack.

13. A furnace comprising:

at least one heating element for heating the furnace;

a conveyor for conveying semiconductor devices through the furnace;

an exhaust stack for venting gases from the furnace;

a device for monitoring residue build-up in the furnace exhaust stack attached to the exhaust stack, wherein the device for monitoring residue build-up comprises a light emitter and a light sensor, wherein the light emitter and the light sensor are located adjacent to each other and the device further comprises a reflector, mounted on an opposing side of the exhaust stack to the light emitter and light sensor, wherein said reflector reflects light emitted by the emitter back across the exhaust stack towards the sensor.

14. The furnace of claim 11, wherein the light emitter further comprises a filter that allows selected wavelengths of light to pass through the exhaust stack.

15. The furnace of claim 8, wherein the light sensor is selected from the group consisting of photovoltaic cells, photomultipliers, thermistors, thermocouples, thermopiles, Golay cells, and pyroelectric detectors.

16. The furnace of claim 8, wherein the device further comprises a microprocessor, a device for inputting data to the microprocessor, and a display for outputting residue build-up data and alarms.

17. A furnace comprising:

at least one heating element for heating the furnace;

a conveyor for conveying semiconductor devices through the furnace;

an exhaust stack for venting gases from the furnace; a device for monitoring residue build-up in the furnace exhaust stack attached to the exhaust stack, wherein the device for monitoring residue build-up comprises a light emitter and a light sensor, and wherein the residue is a flux residue.

18. The furnace of claim 13, wherein the device for monitoring residue build-up comprises a plurality of windows to allow light emitted by the light emitter to pass through the exhaust stack and to be detected by the light sensor.

* * * * *

UNITED STATES PATENT AND TRADEMARK OFFICE
CERTIFICATE OF CORRECTION

PATENT NO.    : 6,536,649 B1
DATED         : March 25, 2003
INVENTOR(S)   : Raj N. Master et al.

It is certified that error appears in the above-identified patent and that said Letters Patent is hereby corrected as shown below:

Column 8,
Line 46, change "claim 9" to -- claim 8 --.

Signed and Sealed this

Eighth Day of July, 2003

JAMES E. ROGAN
*Director of the United States Patent and Trademark Office*